US009949386B2

(12) United States Patent
Matsuyama et al.

(10) Patent No.: US 9,949,386 B2
(45) Date of Patent: Apr. 17, 2018

(54) MOTOR DEVICE (71) Applicant: DENSO CORPORATION, Kariya, Aichi-pref. (JP)

(72) Inventors: Takuya Matsuyama, Kariya (JP); Takashi Hoshino, Kariya (JP); Kazuyuki Watanabe, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 15/607,987

(22) Filed: May 30, 2017

(65) Prior Publication Data
US 2018/0007802 A1 Jan. 4, 2018

(30) Foreign Application Priority Data

Jul. 1, 2016 (JP) ................. 2016-131712

(51) Int. Cl.
| H02K 11/00 | (2016.01) |
| H05K 5/00 | (2006.01) |
| H05K 5/06 | (2006.01) |
| H02K 5/08 | (2006.01) |
| H02K 11/30 | (2016.01) |
| F16F 9/30 | (2006.01) |
| H01R 13/52 | (2006.01) |

(52) U.S. Cl.
CPC ............ *H05K 5/0056* (2013.01); *H02K 5/08* (2013.01); *H05K 5/06* (2013.01); *F16F 9/306* (2013.01); *H01R 13/52* (2013.01); *H02K 11/30* (2016.01)

(58) Field of Classification Search
CPC .......... H02K 5/225; H02K 3/522; H02K 3/24; H02K 9/06; H02K 9/22
USPC ................. 310/71, 62, 64; 361/730
See application file for complete search history.

(56) References Cited

U.S. PATENT DOCUMENTS 7,705,498 B2 * 4/2010 Ortoman ................ H02K 5/225
310/68 B
7,859,149 B2 * 12/2010 Uchimura ............ H02K 7/1166
310/233

(Continued)

FOREIGN PATENT DOCUMENTS

| JP | 2010-057293 A | 3/2010 |
| JP | 2010-136587 A | 6/2010 |

(Continued)

OTHER PUBLICATIONS

U.S. Appl. No. 15/607,816, filed May 30, 2017, Ishimoto et al.
U.S. Appl. No. 15/608,381, filed May 30, 2017, Matsuyama et al.
U.S. Appl. No. 15/608,259, filed May 30, 2017, Watanabe

*Primary Examiner* — Hien Vu
(74) *Attorney, Agent, or Firm* — Posz Law Group, PLC (57) ABSTRACT A case includes a base and a cover and defines an accommodation space therein. The base has a first through hole through which a magnetoelectric conversion element, which is mounted on a circuit board, is opposed to a sensor magnet of a motor. A connector includes a terminal and a housing, which supports the terminal. The connector has a first protrusion projected toward the base for positioning. The first protrusion of the connector has a tip end inserted through a second through hole of the printed circuit board and further inserted in a hole portion of the base. A second protrusion of the base is projected toward the printed circuit board and is inserted in a third through hole of the printed circuit board for positioning.

6 Claims, 8 Drawing Sheets (56) References Cited

U.S. PATENT DOCUMENTS

| | | | | |
|---|---|---|---|---|
| 8,310,121 B2* | 11/2012 | Fujita | ............... | B62D 5/0406 |
| | | | | 310/64 |
| 9,000,633 B2* | 4/2015 | Yamasaki | ............ | B62D 5/0406 |
| | | | | 310/64 |
| 2009/0146510 A1 | 6/2009 | Uchimura | | |
| 2015/0282362 A1 | 10/2015 | Nuriya et al. | | |

FOREIGN PATENT DOCUMENTS

| | | |
|---|---|---|
| JP | 5668674 B2 | 2/2015 |
| JP | 2015-203392 A | 11/2015 |

* cited by examiner

MOTOR DEVICE

CROSS REFERENCE TO RELATED APPLICATION

This application is based on Japanese Patent Application No. 2016-131712 filed on Jul. 1, 2016, the disclosure of which is incorporated herein by reference.

TECHNICAL FIELD

The present disclosure relates to a motor device.

BACKGROUND

Patent Literature 1 discloses an electronic device including a connector having a positioning protrusion for positioning. The positioning protrusion is inserted through a through hole of a printed circuit board. The positioning protrusion is further inserted into a hole portion of a case. The printed circuit board forms a circuit board. The present configuration enables to position both the connector and the circuit board relative to the case.

Patent Literature 1

Publication of Japanese Patent No. 5668674

In addition, a known motor device includes a motor and a circuit board, which are integrated with each other. The circuit board has a drive circuit for the motor. A known configuration of the motor device includes a case including a base. The base has a one side equipped with the circuit board. The motor is located on an opposite surface of the one side. The motor includes a sensor magnet in addition to a stator and a rotor. The sensor magnet is mounted on a surface of the rotor on the side of the base. The electronic component includes a magnetoelectric conversion element, which is mounted on a surface opposed to the base. The magnetoelectric conversion element is mounted to be opposed to the sensor magnet through a through hole, which is formed in the base. In this way, the magnetoelectric conversion element is configured to detect rotation of the motor.

The configuration of the motor device of the present example requires the magnetoelectric conversion element, which is mounted on the printed circuit board, to be opposed to the sensor magnet through the through hole, which is formed in the base. Therefore, the configuration of the present example requires a higher positioning accuracy of the circuit board relative to the case than a positioning accuracy of another component such as an electronic control unit (ECU).

In the positioning configuration of Patent Literature 1, the position of the circuit board relative to the case is determined with the positioning protrusion of the connector. A dimensional tolerance of a positioning variation between the case and the circuit board is a summation of a dimensional tolerance of a positioning variation, which is between the case and the connector, and a dimensional tolerance of a positioning variation, which is between the connector and the circuit board. In consideration of the accumulated summation of the dimensional tolerance, it would be difficult to enhance a detection accuracy of the rotation angle of the motor.

SUMMARY

It is an object of the present disclosure to produce a motor device including a case and a connector, which can be positioned accurately with each other, and configured to detect a rotation angle of a motor accurately.

According to an aspect of the present disclosure, a motor device comprises a case including a base and a cover. The base has a first through hole, a surface, and a cover mounting surface, which is on an opposite side of the surface. The cover is mounted to the cover mounting surface and defines an accommodation space with the base. The motor device further comprises a motor including a stator, a rotor, and a sensor magnet. The rotor is rotational inside the stator. The sensor magnet is mounted on a face of the rotor on a side of the base for detection of a rotary position of the rotor. The motor is located on a side of the surface of the base. The motor device further comprises a circuit board located in the accommodation space and including a printed circuit board and a plurality of electronic components forming a circuit to drive the motor. The printed circuit board has a one side, which is opposed to the base, and a rear side, which is an opposite surface of the one side in a thickness direction. The electronic components are mounted on both the one side and the rear side of the printed circuit board. The electronic components include a magnetoelectric conversion element mounted on the one side of the printed circuit board and opposed to the sensor magnet through the first through hole of the base. The motor device further comprises a connector including a terminal and a housing. The terminal is mounted on the printed circuit board. The housing includes a body located mainly on a side of the rear side of the printed circuit board and supporting the terminal. The housing of the connector has a first protrusion projected from the body toward the base for positioning. The printed circuit board has a second through hole and a third through hole. The first protrusion of the connector is inserted in the second through hole. The base has a hole portion and a second protrusion. The first protrusion of the connector has a tip end inserted through the second through hole of the printed circuit board and further inserted in the hole portion of the base. The second protrusion of the base is projected toward the printed circuit board and is inserted in the third through hole for positioning.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION

As follows, multiple embodiments will be described with reference to drawings. In multiple embodiments, the same referential numeral will be assigned to an element, which functionally and/or structurally corresponds to another element.

First Embodiment

To begin with, an overview of a valve timing control apparatus will be described with reference to FIG. 1. The valve timing control apparatus is applied with a motor device according to the present embodiment.

Figure 1:
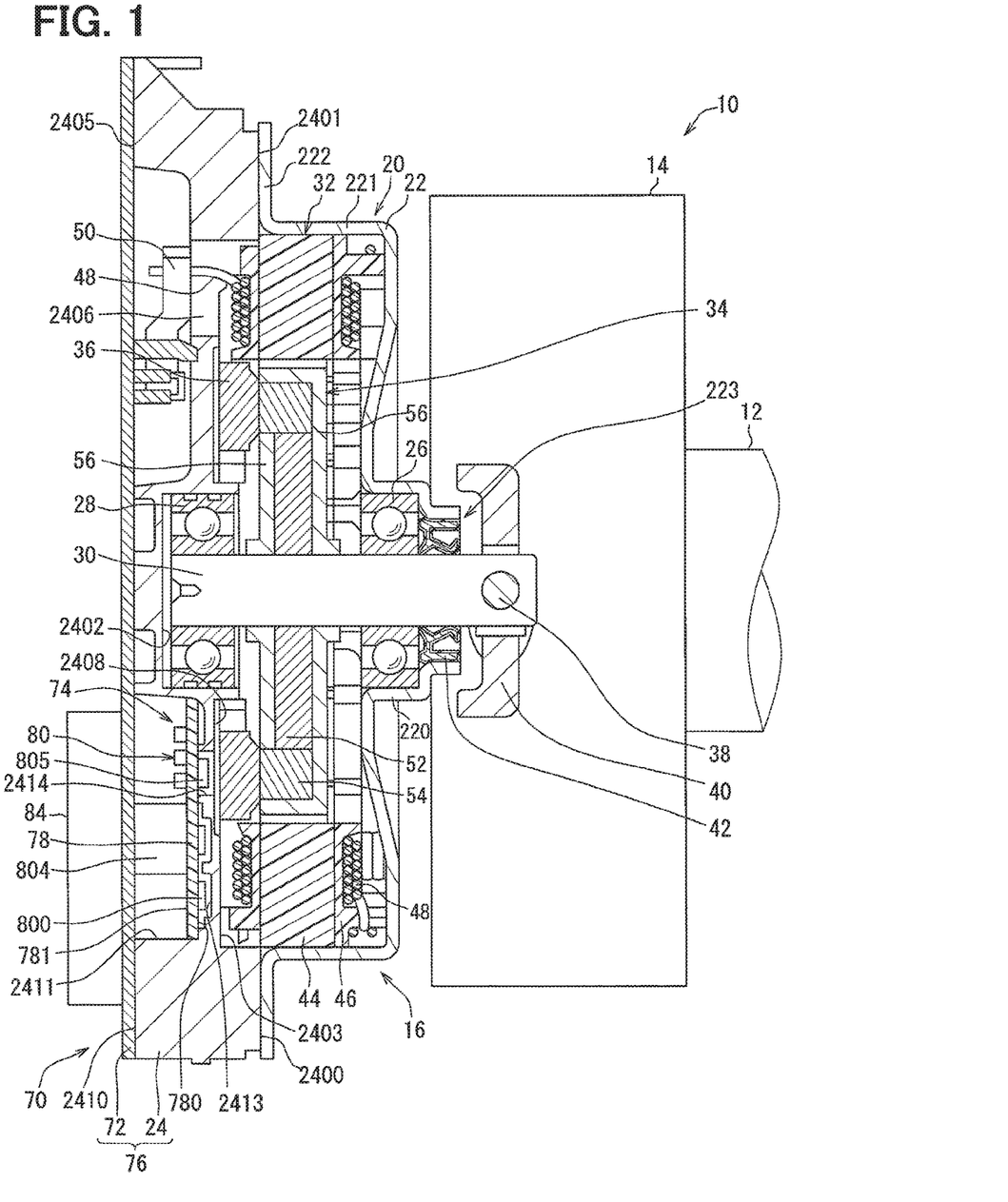
FIG. 1 is a sectional view showing a configuration of a valve timing control apparatus to which a motor device according to the first embodiment is applied.

As shown in FIG. 1, a valve timing control apparatus 10 is used in a transmission system which transmits crank torque from a crank axis of an internal combustion engine (not shown) to a camshaft 12 in a vehicle. The camshaft 12 receives transmission of the crank torque to open and close an intake valve of movable valves (not shown) of the internal combustion engine. The valve timing control apparatus 10 controls a valve timing of the intake valve by using a motor 20, as described later.

The valve timing control apparatus 10 includes a phase control mechanism 14 and a motor device 16. The configuration of the phase control mechanism 14 may be substantially equivalent to the configuration disclosed in Japanese published unexamined application No. 2015-203392. Therefore, the configuration of the phase control mechanism 14 may be referred to the description of Japanese published unexamined application No. 2015-203392. Therefore, FIG. 1 illustrates the phase control mechanism 14 as simplified. In addition, detailed description of the phase control mechanism 14 is omitted in the present description.

Subsequently, overview of the motor device 16 will be described with reference to FIGS. 1 to 10. In FIG. 6, the dashed line shows the heat dissipation gel 90 in order to indicate the position of a heat dissipation gel 90 relative to a circuit board 74. FIG. 9 is a sectional view showing an actuating device 70 taken along the line IX-IX in FIG. 5. FIG. 9 is a sectional view further including a cover 72. In FIG. 9, illustration of a terminal 840 of an external connector 84 is omitted.

As shown in FIG. 1, the motor device 16 includes the motor 20 and the actuating device 70. The motor device 16 may be also referred to as a rotary electric device accommodating the actuating device 70 (electronic driver unit: EDU).

Figure 2:
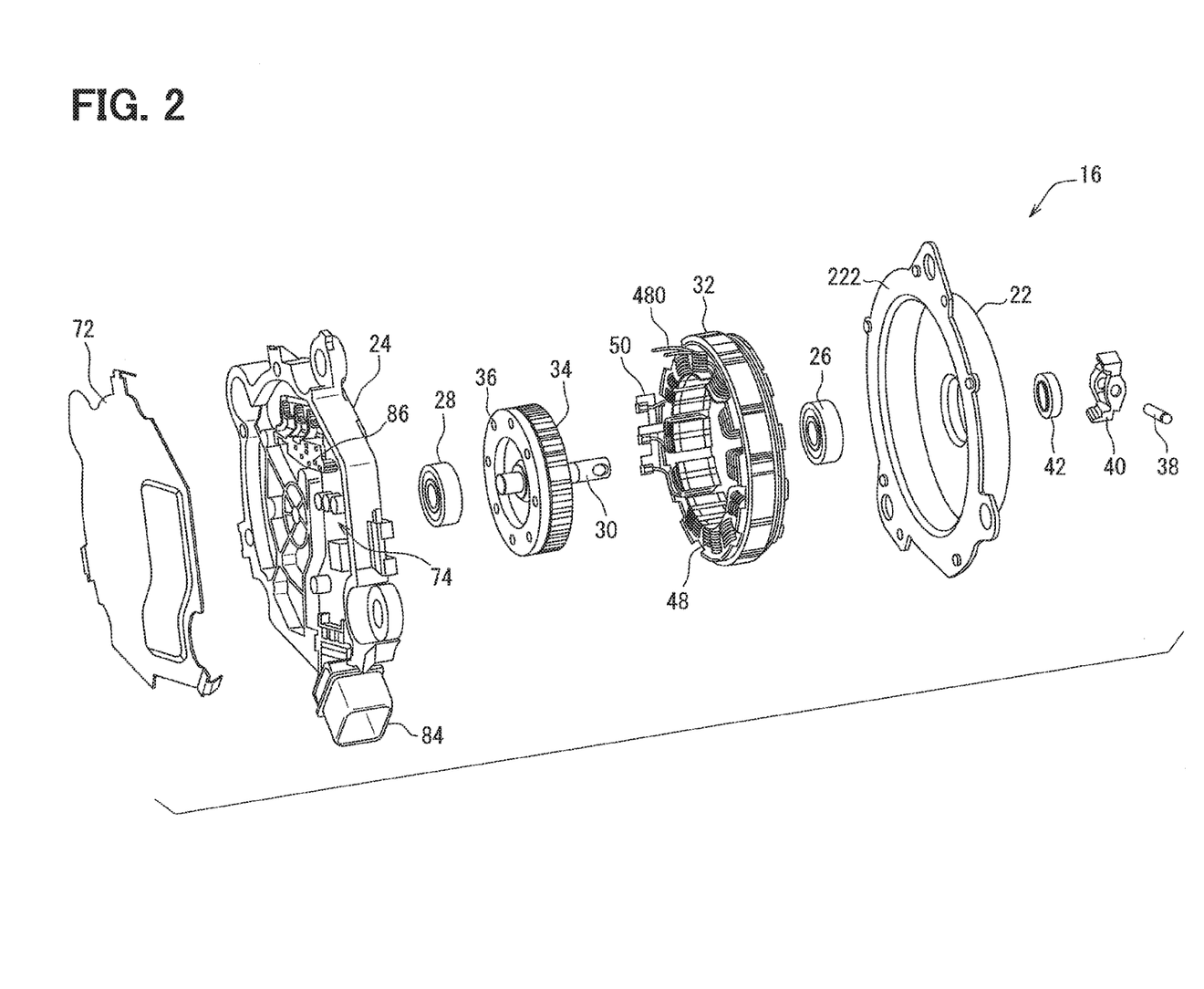
FIG. 2 is an exploded perspective view showing the configuration of the motor device.

The motor 20 is a brushless permanent magnet type synchronous motor. As shown in FIGS. 1 and 2, the motor 20 includes a housing 22, a base 24, bearings 26 and 28, a motor axis 30, a stator 32, a rotor 34, and a sensor magnet 36.

The housing 22 is formed of a metallic material, such as a ferrous material, to be substantially in a bottomed tubular shape. The base 24 is formed of an aluminum material to be substantially in a circular plate shape. The base 24 is equipped to cover the housing 22. The housing 22 is mounted to the base 24 to form an accommodation space. The accommodation space accommodates other elements 26, 28, 30, 32, 34, and 36 of the motor 20. In this way, the housing 22 and the base 24 form a case of the motor 20. In the internal combustion engine, the housing 22 and the base 24 are mounted to a stationary component, such as a chain cover.

Referring to FIG. 1, the housing 22 includes a small diameter portion 220, a large diameter portion 221, and a flange portion 222. The small diameter portion 220 is equipped on the side of the phase control mechanism 14 in an axial direction of the motor axis 30. Hereinafter, the axial direction of the motor axis 30 will be simply referred to as an axial direction. The large diameter portion 221 is equipped on the side of the actuating device 70. The large diameter portion 221 is larger than the small diameter portion 220 in diameter. The flange portion 222 is connected to an end of the large diameter portion 221 on the side of the actuating device 70. The flange portion 222 is extended radially outward. The flange portion 222 is equipped to an outer periphery portion 2401 of a one side 2400 of the base 24 on the side of the phase control mechanism 14. A sealing member (not shown) is equipped between the outer periphery portion 2401 and the flange portion 222 in order to seal an accommodation space formed between the housing 22 and the base 24 in a waterproof manner.

Each of bearings 26 and 28 supports the motor axis 30 to enable the motor axis 30 to rotate in a normal direction and a reverse direction. An outer ring of the bearing 26 on the side of the phase control mechanism 14 in the axial direction is affixed to an inner surface of the small diameter portion 220 of the housing 22. An inner ring of the bearing 26 is affixed to the motor axis 30. The bearing 26 is substantially entirely located inside the small diameter portion 220 in the axial direction.

Figure 3:
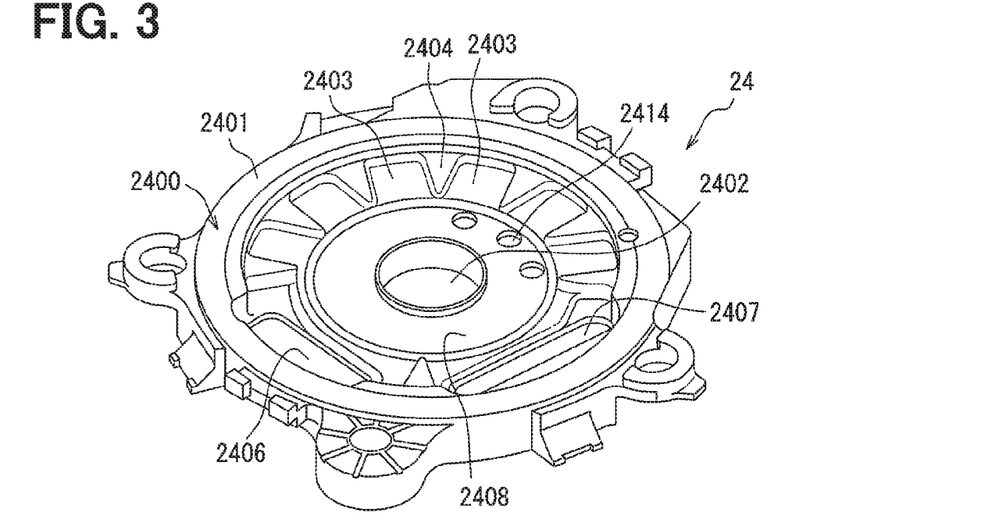
FIG. 3 is a perspective view showing a base viewed from the side of a motor.

As shown in FIGS. 1 and 3, the base 24 includes a first recessed portion 2402 in the one side 2400. The first recessed portion 2402 is recessed relative to the outer periphery portion 2401. The first recessed portion 2402 is equipped corresponding to the bearing 28 and the motor axis 30. The first recessed portion 2402 is located close to the center of the base 24, which is substantially in a circular plate shape. The first recessed portion 2402 has the depth, which is 1 12 or more of the thickness of the base 24. The bearing 28 and one end of the motor axis 30 are accommodated in the first recessed portion 2402. More specifically, the outer ring of the bearing 28 is affixed to the inner circumferential periphery of the first recessed portion 2402. The inner ring of the bearing 28 is affixed to the motor axis 30. The bearing 28 supports the one end of the motor axis 30 such that the one end does not contact with the base 24.

The housing 22 has an opening 223, which is formed close to the center of the bottom portion of the housing 22. The motor axis 30 projects through the opening 223 to the outside of the through the housing 22. The motor axis 30 is connected with the phase control mechanism 14. A through hole is formed in an end of the motor axis 30 on the side of the phase control mechanism 14. As shown in FIGS. 1 and 2, a pin 38 is inserted through the through hole. In this way, a joint 40, which is to be connected with the phase control mechanism 14, is affixed to the motor axis 30. In addition, an annular sealing member 42 is interposed between the inner periphery of the opening 223 of the housing 22 and the motor axis 30. As the sealing member 42, for example, an oil seal is used. The sealing member 42 is located closer to the phase control mechanism 14 than the bearing 26.

The stator 32 is located on the side of the one side 2400 of the base 24. The stator 32 is formed in a tubular shape. The stator 32 includes multiple stator cores 44 and multiple windings 48. The stator cores 44 include multiple teeth portions, respectively. The windings 48 are wound around resin bobbins 46 via teeth portions, respectively. Each of the stator cores 44 is formed by stacking metal pieces. The stator cores 44 are arranged at a regular interval along a circumferential direction, which is a rotational direction of the motor axis 30. The windings 48 are individually wound around the corresponding stator cores 44, respectively. That is, the windings 48 are also arranged along the circumferential direction at the regular interval. The windings 48 corresponding to the U phase, the V phase, and the W phase of the motor 20 are connected to each other through terminal 50 for forming a neutral point. The windings 48 are supplied with a driving current via the internal connector 86, which will be described later, and thereby the stator 32 generates a rotational magnetic field. The rotational magnetic field acts on the permanent magnet 54 of the rotor 34, which will be later. The stator 32 is supported by the housing 22.

As shown in FIG. 3, the base 24 includes multiple second recessed portions 2403 and multiple reinforcement portions 2404. The second recessed portions 2403 are recessed relative to the outer periphery portion 2401 in the one side 2400. The second recessed portions 2403 are formed correspondingly to the windings 48 of the stator 32, respectively. That is, the second recessed portions 2403 are formed at a regular interval in the circumferential direction. The second recessed portions 2403 accommodate the corresponding windings 48, respectively. The second recessed portions 2403 are shallower than the first recessed portion 2402 in the axial direction.

The reinforcement portion 2404 is equipped between the second recessed portions 2403, which are adjacent to the reinforcement portion 2404 in the circumferential direction. That is, the second recessed portions 2403 and the reinforcement portions 2404 are arranged alternately in the circumferential direction. The reinforcement portion 2404 partitions the second recessed portions 2403 into multiple regions. The reinforcement portion 2404 is shallower than the bottom surface of the second recessed portion 2403 in the one side 2400. The reinforcement portion 2404 is slightly recessed relative to the outer periphery portion 2401. Thus, the reinforcement portion 2404 in the present configuration enables to enhance rigidity of the base 24, compared with a configuration where the second recessed portion 2403 in a circular shape is formed.

Figure 4:
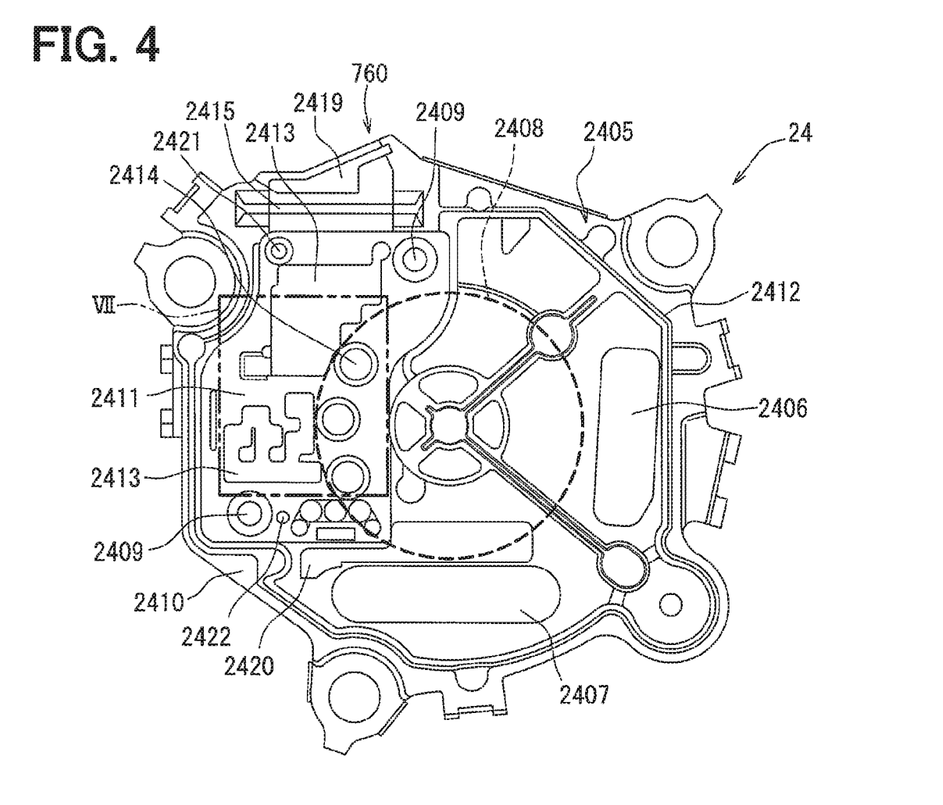
FIG. 4 is a plan view showing the base viewed from the side of a circuit board.

As shown in FIGS. 1, 3, and 4, the base 24 has through holes 2406 and 2407 each extending from the one side 2400 to the rear side 2405, which is on the opposite side of the one side 2400, through the base 24. The through hole 2406 is formed to enable the neutral point of the motor 20 to protrude from the one side 2400 to the rear side 2405. The neutral point of the motor 20 is the joint portion among the terminal 50 and the windings 48 in the all phases. The through hole 2407 is formed to enable the terminal 860 of the internal connector 86 to be electrically connected with the joint portion 480 of each of the windings 48 by, for example, welding.

The rotor 34 is rotatably accommodated inside the stator 32, which is in the tubular shape. The rotor 34 is in a disc shape projected radially outward from the motor axis 30. The rotor 34 is rotational in the circumferential direction in both the normal direction and the reverse direction. The rotor 34 includes a rotor core 52, multiple permanent magnets 54, and a stationary plate 56. The rotor core 52 is formed by stacking two or more disc-shaped core sheets. The multiple permanent magnets 54 are rotational integrally with the rotor core 52. The stationary plate 56 is formed on both ends of the rotor core 52 in the axial direction. The rotor core 52 may be affixed directly to the motor axis 30 or may be affixed to the motor axis 30 via a fitting member. The multiple permanent magnets 54 have different magnetic poles alternately in the circumferential direction.

The sensor magnet 36 is in a ring shape. The sensor magnet 36 is affixed to an outer circumferential peripheral end of the rotor 34 on the side of the base 24. The sensor magnet 36 is rotational integrally with the rotor 34. The sensor magnet 36 is equipped to detect the rotary position of the rotor 34. That is, the sensor magnet 36 is equipped to detect the rotation angle of the motor 20. The sensor magnet 36 is alternately magnetized with an N pole and an S pole at a predetermined angular interval.

As shown in FIGS. 1 and 3, the base 24 includes the first recessed portion 2402 in the one side 2400. The first recessed portion 2402 is recessed relative to the outer periphery portion 2401. The third recessed portion 2408 is formed substantially in an annular shape correspondingly to the sensor magnet 36. The third recessed portion 2408 accommodates the sensor magnet 36. The third recessed portion 2408 is shallower than the first recessed portion 2402 and is deeper than the second recessed portion 2403 in the axial direction. The first recessed portion 2402, the third recessed portion 2408, the second recessed portion 2403, and the outer periphery portion 2401 are arranged in this order from the axial center of the motor axis 30 to the radially outside.

The actuating device 70 includes the cover 72, the circuit board 74, the external connector 84, and the internal connector 86. The base 24 is also a component of the actuating device 70. The base 24 serves for both the motor 20 and the actuating device 70.

The cover 72 is formed of a metallic material, such as a ferrous material, to be substantially in a circular plate shape. The cover 72 is located on the rear side 2405 of the base 24. The rear side 2405 of the base 24 may be equivalent to a cover mounting surface. The circuit board 74 is located in the accommodation space, which is formed by mounting the cover 72 onto the base 24. The base 24 and the cover 72 form a case 76 of the circuit board 74. The case 76, which includes the base 24 and the cover 72, may be equivalent to a case.

The circuit board 74 includes a printed circuit board 78 and multiple electronic components 80. The multiple electronic components 80 are mounted on the printed circuit board 78. The printed circuit board 78 includes a base member and a wiring. The base member contains resin as a material. The wiring is equipped to the base member. The printed circuit board 78 has a one side 780 and a rear side 781. The one side 780 is opposed to the base 24 in the axial direction. The rear side 781 is a surface on the opposite side of the one side 780 in its thickness direction. The thickness direction of the printed circuit board 78 substantially coincides with the axial direction of the motor axis 30.

Figure 5:
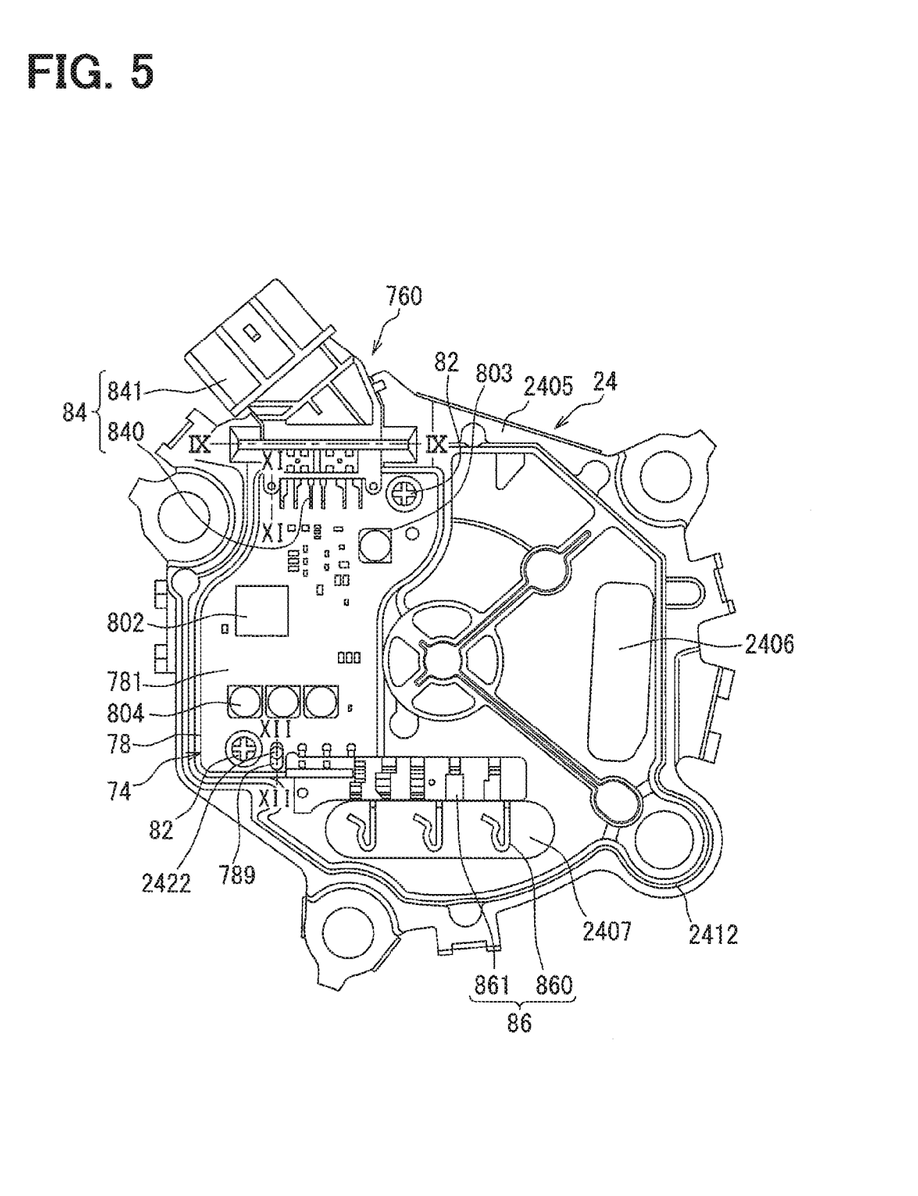
FIG. 5 is a plan view showing a state where the circuit board is affixed to the base.
Figure 6:
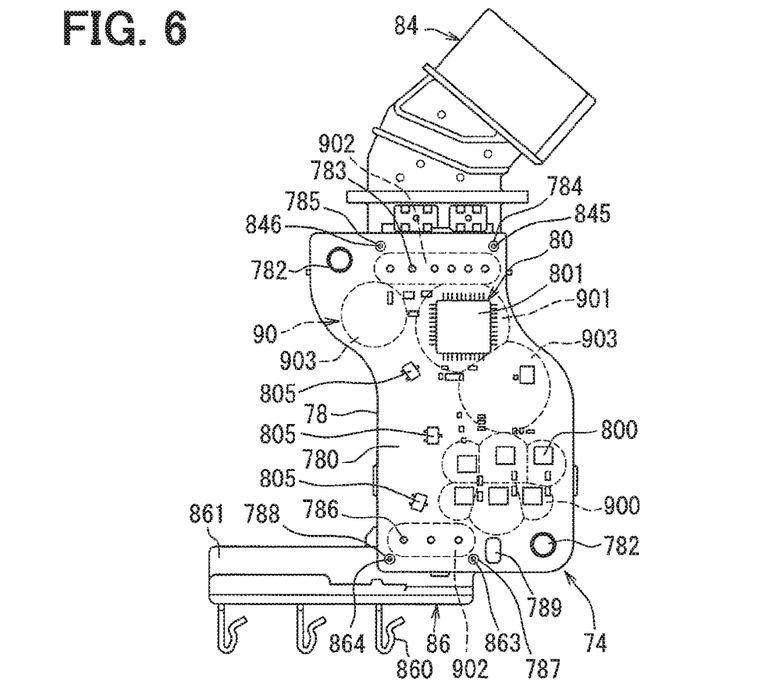
FIG. 6 is a plan view showing the circuit board.

As shown in FIGS. 1 and 5, the printed circuit board 78 is located on the rear side 2405 of the base 24. As shown in FIGS. 5 and 6, the printed circuit board 78 is substantially in a crank form. The printed circuit board 78 is equipped to the rear side 2405, such that the printed circuit board 78 does not overlap with the first recessed portion 2402 in a projection view along the axial direction. That is, the printed circuit board 78 is equipped to circumvent the bearing 28 and the motor axis 30. As shown in FIG. 5, the printed circuit board 78 is affixed to the base 24 with two screws 82. As shown in FIG. 6, the printed circuit board 78 has through holes 782, which are formed at the diagonal positions corresponding to the screws 82. As shown in FIG. 4, the base 24 has screw holes 2409, which are formed corresponding to the screws 82.

As shown in FIGS. 1 and 4, the base 24 has an outer periphery portion 2410 and a fourth recessed portion 2411 in the rear side 2405. The outer periphery portion 2410 is mounted with the cover 72. The fourth recessed portion 2411 is recessed relative to the outer periphery portion 2410 in the axial direction. The fourth recessed portion 2411 is equipped correspondingly to the circuit board 74. The circuit board 74 is mostly accommodated in the fourth recessed portion 2411. The outer periphery portion 2410 has an opposite portion opposed to the cover 72. The opposite portion of the outer periphery portion 2410 has a sealing groove 2412, which is mounted with the sealing member 88, which will be described later.

The multiple electronic components 80 are mounted on both the one side 780 and the rear side 781 of the printed circuit board 78. The electronic components 80 include MOSFETs 800, a driver IC 801, a coil 802, capacitors 803 and 804 and/or the like. The electronic components 80 are elements forming a circuit to drive the motor 20 together with the wiring of the printed circuit board 78. The MOSFETs 800 form a three-phase inverter to drive the motor 20. In the present configuration, six elements of the MOSFETs 800 are mounted on the one side 780 of the printed circuit board 78. The three-phase inverter includes upper arms and lower arms corresponding to three phases. The upper arms of three phases are connected to a high potential power source line. The lower arms of the three phases are connected to a low potential power source line.

The driver IC 801 detects the rotary position of the rotor 34 according to a detection signal of hall elements 805, which will be described later. The driving power IC 801 acquires, from a microcomputer of an ECU (not shown), a signal to instruct the rotational direction and the revolution of the motor 20. The driving power IC 801 generates a gate driving signal for each of the MOSFETs 800 according to the instruction signal and the rotary position. Thus, the driving power IC 801 sends the gate driving signal to each of the MOSFETs 800.

Figure 7:
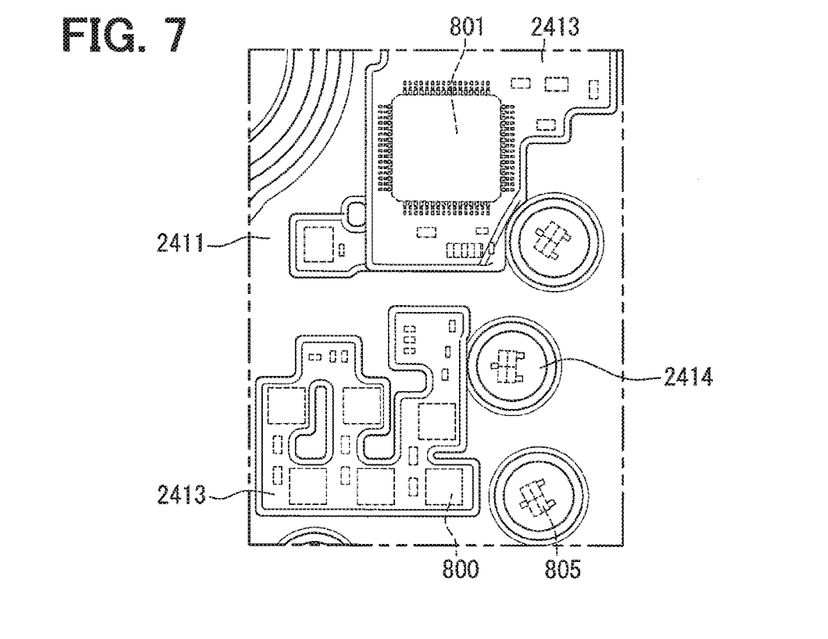
FIG. 7 is a view showing a physical relationship between the base and the electronic component in a region shown by a two-point chain line VII in FIG. 4.

As shown in FIGS. 1, 4, and 7, the base 24 has fifth recessed portions 2413 in the rear side 2405. The fifth recessed portions 2413 are further recessed relative to the bottom surface of the fourth recessed portion 2411. The fifth recessed portions 2413 are formed correspondingly to at least a part of the electronic components 80, which are located on the one side 780 of the printed circuit board 78, excluding the hall elements 805. In FIG. 7, in order to show the physical relationship of the base 24 and the electronic components 80, the electronic components 80 are illustrated with the dashed line.

The fifth recessed portions 2413 are formed correspondingly to the MOSFETs 800 and the driver IC 801, respectively. As shown in FIG. 4, the fifth recessed portions 2413 are formed at positions, which do not overlap with the third recessed portion 2408 in a projection view along the axial direction. That is, the fifth recessed portions 2413 are formed at positions, which do not overlap with sensor magnet 36. In FIG. 4, the dashed line shows, as a reference line, the outer circumferential periphery of the third recessed portion 2408 formed in the one side 2400. In the present embodiment, a part of the MOSFETs 800 is accommodated in the fifth recessed portion 2413 in the axial direction.

The coil 802 and the capacitors 803 and 804 are mounted on the rear side 781 of the printed circuit board 78. The coil 802 and the capacitors 803 and 804 are tall components, which are taller than other elements of the electronic components 80 in the axial direction. The coil 802 and the capacitor 803 form a noise filter. The capacitor 804 is a smoothing capacitor. In the present embodiment, three capacitors 804 are mounted on the printed circuit board 78 for stabilization. The capacitor 804 is mounted on a rear surface portion of a mounting region where the multiple MOSFETs 800 are mounted in the printed circuit board 78.

The hall elements 805 are also mounted as the electronic component 80 on the printed circuit board 78. Each of the hall elements 805 detects the rotary position of the rotor 34 and sends the detection signal to the driver IC 801. The hall elements 805 are mounted on the one side 780 in the printed circuit board 78. The hall elements 805 are equipped correspondingly to the sensor magnets 36. In the present embodiment, the hall elements 805 include three elements equipped at a predetermined rotation angular interval along the circumferential direction. The hall elements 805 may be equivalent to a magnetoelectric conversion element.

The base 24 has through holes 2414, each of which extends from the one side 2400 to the rear side 2405 through the base 24. The through holes 2414 are formed correspondingly to the hall elements 805. Each of the hall elements 805 is individually accommodated in corresponding one of the through holes 2414. The present configuration, in which the hall elements 805 are equipped in the through holes 2414, respectively, enables to downsize the motor device 16 in the axial direction. In addition, the present configuration further enables to avoid decrease in the sensor sensitivity caused by an eddy current arising in the metallic base 24. The through holes 2414 are formed in the bottom surface of the third recessed portion 2408. The through hole 2414 is equivalent to a first through hole.

Figure 8:
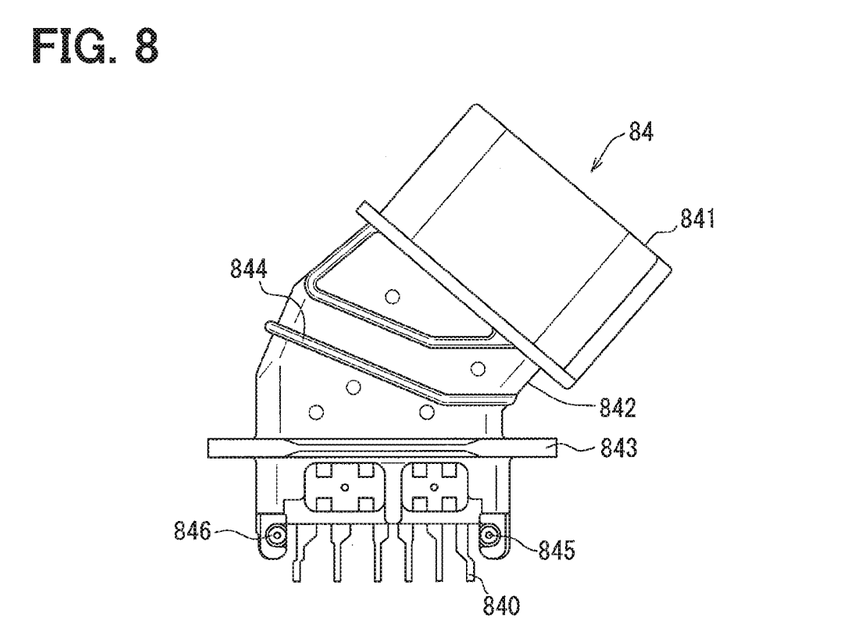
FIG. 8 is a plan view showing an external connector.
Figure 9:
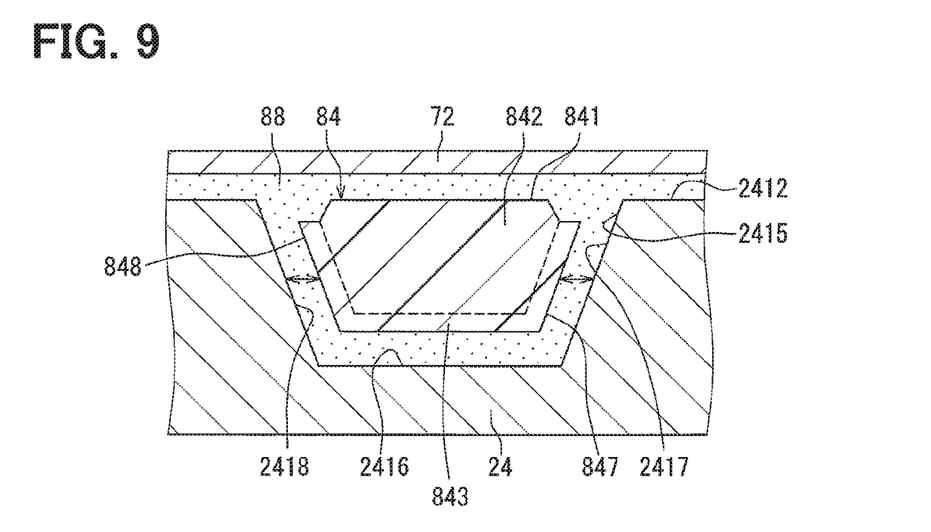
FIG. 9 is a sectional view showing the actuating device and taken along the line IX-IX in FIG. 5.

As shown in FIGS. 5, 6, and 8, the external connector 84 includes multiple terminals 840 and a housing 841. The multiple terminals 840 are formed of a conductive material, such as phosphor bronze. The housing 841 is formed of resin and configured to retain the terminals 840. The housing 841 is mainly located around the rear side 781 of the printed circuit board 78. The terminal 840 is soldered at one-end in a state where the terminals 840 are inserted in the through holes 783 of the printed circuit board 78. The terminal 840 is configured to be connected with an external device at the other-end side. The terminal 840 electrically relays the ECU with the driver IC 801. Specifically, a microcomputer (not shown) of the ECU sends an instruction signal of the motor 20, and the circuit board 74 receives the instruction signal via the external connector 84. In addition, the ECU receives, via the external connector 84, a diagnostic signal, a signal, which represents an actual revolution speed of the motor 20, and a signal, which represents an actual rotational direction of the motor 20. Those signals are sent from the circuit board 74. The circuit board 74 is supplied with an electric power via the external connector 84. A part of the external connector 84 is projected to the outside through an opening 760 of the case 76. The opening 760 is formed by the base 24 and the cover 72. FIGS. 4 and 5 illustrate only a portion of the opening 760 on the side of the base 24.

As shown in FIG. 8, the housing 841 includes a body portion 842, a first projected portion 843, a second projected portion 844, a first protrusion 845, and a second protrusion 846. The body portion 842 holds the terminal 840. The first projected portion 843 and the second projected portion 844 are projected from the body portion 842 toward the base 24 for sealing. The first protrusion 845 and the second protrusion 846 are projected from the body portion 842 toward the base 24 for positioning. The body portion 842 is formed substantially in a flat V-shape in a plane view. The second projected portion 844 extends from one end of the body portion 842 to the other end of the body portion 842 to straddle over the multiple terminals 840 at a position around a bent point at which the body portion 842 is bent to be in the V-shape. The first projected portion 843 is located at a position closer to a connecting portion, at which the multiple terminals 840 are connected with the circuit board 74, than the second projected portion 844. The first projected portion 843 is extended along an array direction, along which the multiple terminals 840 are arranged, to straddle over the multiple terminals 840.

The first protrusion 845 and a second protrusion 855 are located close to one end of the body portion 842. More specifically, the first protrusion 845 and the second protrusion 855 are located close to the connecting portion at which the multiple terminals 840 are connected with the circuit board 74. The first protrusion 845 and the second protrusion 855 are located on both sides of the connecting portion. A projection length of the first protrusion 845 is larger than a projection length of the second protrusion 846.

As shown in FIG. 4, the outer periphery portion 2410 of the rear side 2405 of the base 24 has a sealing groove 2415 correspondingly to the first projected portion 843. As shown in FIG. 9, the sealing groove 2415 has a bottom surface 2416 and lateral surfaces 2417 and 2418. Both the lateral surfaces 2417 and 2418 are inclined surfaces, respectively. The lateral surface 2417 is connected to one-end side of the bottom surface 2416. The lateral surface 2418 is connected to the other-end side of the bottom surface 2416. The bottom surface 2416 and the lateral surfaces 2417 and 2418 define a space, which is substantially in a trapezoidal shape in cross section. The sealing member 88 is located in the sealing groove 2415. The first projected portion 843 is inserted in the sealing groove 2415 and is tightly in contact with the sealing member 88. The sealing member 88 may be formed of an adhesion material such as a heat hardening material containing, for example, silicone as a main material. The sealing groove 2415 may be equivalent to a groove portion where the sealing member is located. The lateral surface 2417 may be equivalent to a first inclined surface. The lateral surface 2418 may be equivalent to a second inclined surface.

The sealing member 88, which is located in the sealing groove 2415, is integrally connected with the sealing member 88, which is located in the sealing groove 2412. That is, the sealing member 88 is integrally connected with the sealing member 88 which is interposed between the base 24 and the cover 72. In addition, the sealing member 88, which is interposed between the body portion 842 and the cover 72 of the housing 841 is connected with the sealing member 88, which is located in the sealing groove 2415, and a connection portion with the sealing member 88, which is interposed between the base 24 and the cover 72. In this way, the accommodation space of the case 76 is airtightly sealed with the sealing member 88, which is located in the sealing grooves 2412 and 2415, and the sealing member 88, which is interposed between the body portion 842 of the housing 841 and the cover 72.

In addition, the outer periphery portion 2410 of the rear side 2405 of the base 24 has a sixth recessed portion 2419 correspondingly to the second projected portion 844. The sixth recessed portion 2419 is formed in a periphery portion of the base 24 around the opening 760. The sealing member 88 is located additionally in the sixth recessed portion 2419. The second projected portion 844 is inserted in the sixth recessed portion 2419 and is tightly in contact with the sealing member 88. The present configuration enables to enlarge an adhesion area between the external connector 84 and the base 24 via the sealing member 88, compared with a configuration, which does not have the second projected portion 844 and the sixth recessed portion 2419. Therefore, the present configuration enables to restrict both the external connector 84 and the circuit board 74, which is mounted with the external connector 84, from vibrating even in a condition where vibration of the motor 20 is transmitted to the actuating device 70, which is integrated with the motor 20. Therefore, the present configuration enables to enhance vibration-proof property of the device. In addition, the sealing member 88 is once softened in its thermal hardening process. The sixth recessed portion 2419 also exhibits a dam (dike) function, when the softened sealing member 88 overflows from the seal groove 2415 to the outside, to store the overflowing portion of the softened sealing member 88.

As shown in FIG. 6, the printed circuit board 78 has through holes 784 and 785, which are for positioning, correspondingly to the first protrusion 845 and the second protrusion 846. The first protrusion 845 is inserted into a through hole 784, and a second protrusion 856 is inserted into the through hole 785. In this way, the external connector 84 is positioned relative to the circuit board 74 (printed circuit board 78).

Figure 10:
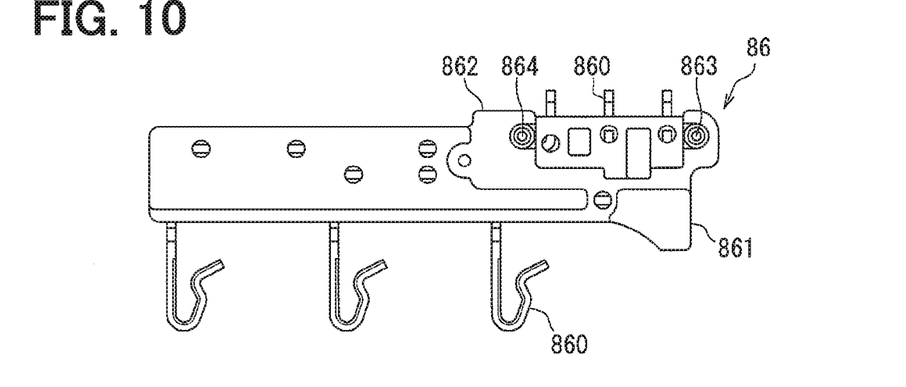
FIG. 10 is a plan view showing the internal connector.

As shown in FIGS. 5, 6, and 10, the internal connector 86 includes the multiple terminals 860 and the housing 861. The multiple terminals 860 are formed of a conductive material, such as phosphor bronze. The housing 861 contains resin as a molding material and supports the terminals 860. The housing 861 is mainly located on the side of the rear side 781 of the printed circuit board 78. The terminal 860 is soldered at the one-end in the state where the terminal 860 is inserted in a through hole 786 of the printed circuit board 78. The terminal 860 is welded at the other-end to the joint portion 480 of the winding 48 of the motor 20. The terminal 860 electrically relays the three-phase output lines of the inverter, which is formed in the circuit board 74, with the windings 48 of the motor 20.

As shown in FIG. 10, the housing 861 includes the body portion 862 and the protrusions 863 and 864. The body portion 862 holds and positions the terminals 860. The protrusions 863 and 864 are projected from the body portion 862 toward the base 24.

The first protrusions 863 and 864 are equipped to interpose therebetween the end of the terminals 860 connected to the printed circuit board 78. As shown in FIG. 6, the through holes 787 and 788 are formed in the printed circuit board 78 correspondingly to the protrusions 863 and 864. The protrusion 863 is inserted in the through hole 787, and the protrusion 864 is inserted in the through hole 787. Thus, the internal connector 86 is positioned relative to the circuit board 74 (printed circuit board 78).

As shown in FIG. 4, the rear side 2405 of the base 24 has a seventh recessed portion 2420 correspondingly to a part of the body portion 862 of the internal connector 86. The sealing member 88 is located additionally in the seventh recessed portion 2420. In this way, the internal connector 86 is adhered and affixed to the base 24 via the sealing member 88. Illustration of those configuration is omitted. The present configuration enables to restrict the internal connector 86 and the circuit board 74, which is mounted with the internal connector 86, from vibrating, even in a condition where vibration of the motor 20 is transmitted to the actuating device 70, which is integrated with the motor 20. Therefore, the present configuration enables to enhance vibration-proof property of the device.

The actuating device 70 further includes the heat dissipation gel 90. The heat dissipation gel 90 is a thermal conduction member having a flexibility. The heat dissipation gel 90 is formed of, for example, a silicone-based material and may contain additive such as metal oxide to enhance a thermal conductivity. The additive may be, for example, zinc oxide. Other than the heat dissipation gel 90, for example, a heat dissipation grease may be used as the thermal conduction member. The heat dissipation gel 90 is interposed between the circuit board 74 and the case 76 in the thickness direction of the printed circuit board 78. In addition, the heat dissipation gel 90 is in contact with both the circuit board 74 and the case 76. The heat dissipation gel 90 is interposed between the circuit board 74 and the case 76 at multiple locations. In FIG. 6, the dashed line shows the outline of the heat dissipation gel 90 applied to the circuit board 74.

In present embodiment, the heat dissipation gel 90 is interposed between the one side 780 of the printed circuit board 78 and the base 24. The heat dissipation gel 90 includes the first thermal conductive portion 900, 901, and 902 and the second thermal conductive portion 903. The first thermal conductive portion 900 is interposed between the MOSFETs 800 and the bottom surface of the fifth recessed portion 2413, which is formed in the base 24 correspondingly to the MOSFETs 800. In addition, the first thermal conductive portion 900 is further interposed between the circumference portions of the MOSFETs 800 in the one side 780 and the bottom surface of the fifth recessed portion 2413. The first thermal conductive portion 901 is interposed between the driver IC 801 and the fifth recessed portion 2413, which is formed in the base 24 correspondingly to the driver IC 801. In addition, the first thermal conductive portion 901 is further interposed between the circumference portion of driver IC 801 in the one side 780 and the fifth recessed portion 2413. The first thermal conductive portion 902 is interposed between the mounting portion of the terminals 840 and 860 in the printed circuit board 78 and the base 24. In addition, the first thermal conductive portion 902 is further interposed between the circumference portion of the mounting portion of the terminals 840 and 860 in the printed circuit board 78 and the base 24. That is, the first thermal conductive portion 902 is interposed between the circumference portion of the through holes 783 and 784 in the printed circuit board 78 and the base 24. The first thermal conductive portions 900, 901, and 902 mainly transmits heat of the circuit board 74 to the base 24.

The second thermal conductive portion 903 is formed of the same material as the material of the first thermal conductive portions 900, 901, and 902. The second thermal conductive portion 903 is interposed with the case 76 at a position, which is different from the positions where the first thermal conductive portions 900, 901, and 902 are interposed with the case 76. The second thermal conductive portion 903 restricts vibration of the circuit board 74 mainly with the damper effect. In present embodiment, the second thermal conductive portion 904 is interposed between the base 24 and the rear side portion of the mounting region of the coil 802, which is the tall component, in the one side 780 of the printed circuit board 78. In addition, the second thermal conductive portion 904 is further interposed between the base 24 and the rear side portion of the mounting region of the capacitor 803, which is the tall component, in the one side 780 of the printed circuit board 78.

Figure 11:
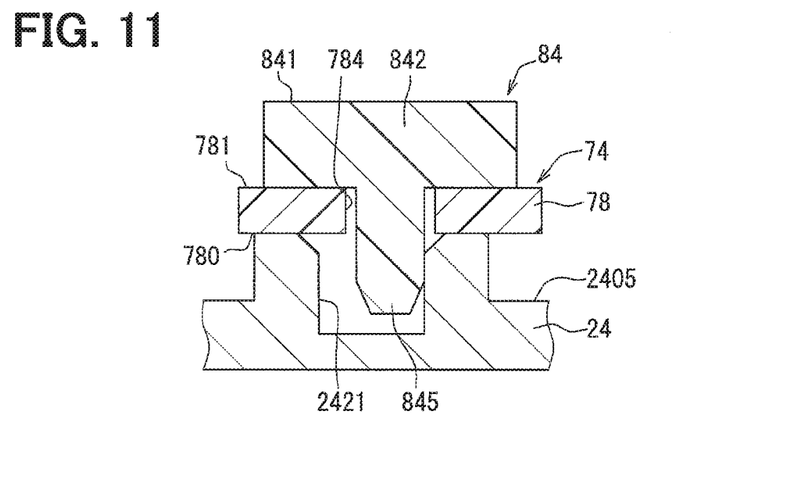
FIG. 11 is a sectional view taken along the line XI-XI in FIG. 5.
Figure 12:
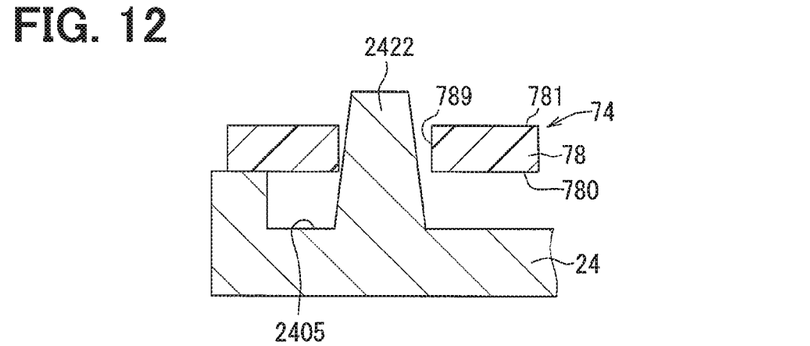
FIG. 12 is a sectional view taken along the line XII-XII in FIG. 5.

Subsequently, the positioning configuration of the circuit board 74 and the external connector 84 relative to the base 24 will be described with reference to FIGS. 4, 5, 6, 11, and 12. FIG. 11 is a sectional view taken along the line XI-XI in FIG. 5. FIG. 12 is a sectional view taken along the line XII-XII in FIG. 5.

As described above, the external connector 84 includes the first protrusion 845 for positioning. In addition, the printed circuit board 78 has the through hole 784, which is formed correspondingly to the first protrusion 845. Furthermore, as shown in FIGS. 4 and 11, the base 24 has a hole portion 2421, which is formed correspondingly to the first protrusion 845. The hole portion 2421 opens in the rear side 2405.

The first protrusion 845 is inserted through the through hole 784. In addition, the first protrusion 845, which is inserted through the through hole 784, has a tip end portion, which is further inserted into the hole portion 2421. The first protrusion 845 is arranged to be in contact with the sidewall of the hole portion 2421. The through hole 784 is equivalent to a second through hole.

Furthermore, as shown in FIG. 6, the second protrusion 846 is inserted through the through hole 785 of the printed circuit board 78. It is noted that, as described above, the second protrusion 846 is formed to be shorter than the first protrusion 845. Therefore, the present configuration enables to avoid interference between the second protrusion 846 and the base 24. Furthermore, a hole portion, which corresponds to the second protrusion 846, is not formed in the base 24.

As shown in FIGS. 5, 6, and 12, the printed circuit board 78 has a through hole 789. The through hole 789 is in an elongated hole shape. In present embodiment, as shown in FIGS. 5 and 6, the through hole 789 has a circumferential length (width), which is the length in the circumferential direction centering on the through hole 784. The through hole 789 has a radial length (height), which is in the radial direction centering on the through hole 784. The radial length (height) is larger than the circumferential length (width). In addition, the through hole 784 is formed on the one-end side in the longitudinal direction of the printed circuit board 78. The through hole 789 is formed on the other-end side in the longitudinal direction of the printed circuit board 78. The present structure enables to have a long distance between the through holes 784 and 789. The through hole 789 is equivalent to a third through hole.

The base 24 includes the protrusion 2422 formed correspondingly to the through hole 789. The protrusion 2422 is projected from the rear side 2405 toward the circuit board 74. The protrusion 2422 is inserted in the through hole 789. The protrusion 2422 and the wall surface of the through hole 789 have a small clearance therebetween in the circumferential direction. In present embodiment, the protrusion 2422 is in a trapezoidal conical shape, which is a conical shape having a trapezoidal cross section. In addition, the protrusion 2422 is inserted through the through hole 789.

Subsequently, effects of the motor device 16 according to the present embodiment will be described.

In present embodiment, the first protrusion 845 of the external connector 84 is inserted in the hole portion 2421 of the base 24. Therefore, the present configuration enables to position the external connector 84 relative to the base 24 (case 76) with sufficient accuracy. In this way, the present configuration enables to restrict a positional deviation of the external connector 84 (housing 841) relative to the seal groove 2415. Therefore, as shown by the arrow in FIG. 9, the distance between a portion of the housing 841 and the lateral surface 2417, which are opposed to each other, becomes substantially the same as the distance between a portion of the housing 841 and the lateral surface 2418, which are opposed to each other. The present structure enables to restrict the sealing member 88 from being eccentrically positioned. Therefore, the present structure enables to avoid insufficient airtight sealing property due to shortage of the sealing member 88 and/or to avoid overflowing of the sealing member 88 due to its excessive amount.

In addition, the first protrusion 845 of the external connector 84 is inserted through the through hole 784 of the printed circuit board 78 and is further inserted into the hole portion 2421 of the base 24. In the present positioning portion, the circuit board 74 is positioned relative to the base 24 via the first protrusion 845. It is further noted that, the protrusion 2422, which is equipped to the base 24, is inserted into the through hole 789 of the printed circuit board 78. In the present positioning portion, the circuit board 74 is positioned relative to the base 24 without via the external connector 84. In this way, the circuit board 74 is positioned at the two locations. Therefore, the present configuration enables to restrict the positional deviation of the circuit board 74 additionally in the rotational direction. Therefore, the present configuration enables to position the hall element 805, which is mounted on the printed circuit board 78, to be opposed to the sensor magnet 36 through the through hole 2414, which is formed in the base 24, with sufficient accuracy. That is, the present configuration enables to detect the rotation angle of the motor 20 with sufficient accuracy.

As described above, the motor device 16 of the present embodiment enables to position the external connector 84 relative to the case 76 with sufficient accuracy and further enables to detect the rotation angle of the motor 20 with sufficient accuracy.

Furthermore, according to the present embodiment, the through hole 789, in which the protrusion 2422 of the base 24 is inserted, is in the elongated hole shape. The through hole 789 is in the elongated hole shape. Specifically, the through hole 789 has a circumferential length (width), which is the length in the circumferential direction (rotational direction) centering on the through hole 784. The through hole 789 has a radial length (height), which is in the radial direction centering on the through hole 784. The radial length (height) is larger than the circumferential length (width). The present configuration enables to restrict the positional deviation in the circumferential direction, while permitting, in the radial direction, an assembly error of the printed circuit board 78 relative to the base 24, a product dimensional tolerance, and/or an alpha difference of each of and/or the combination of the printed circuit board 78 relative to the base 24.

In addition, in the present embodiment, the through hole 784 is formed on the one-end side in the printed circuit board 78, and the through hole 789 is formed on the other-end side in the printed circuit board 78 in the longitudinal direction of the printed circuit board 78. The present configuration enables to secure the long distance between the through holes 784 and 789 for positioning the circuit board 74 relative to the base 24. Therefore, the present configuration enables to position the circuit board 74 relative to the base 24 with more sufficient accuracy.

In addition, according to the present embodiment, the rear side 2405 of the base 24 has the fifth recessed portion 2413 correspondingly to the MOSFETs 800. In addition, the first thermal conductive portion 900 is located in the fifth recessed portion 2413 while being in contact with the MOSFETs 800. The fifth recessed portion 2413 enables to restrict movement of the first thermal conductive portion 900 (heat dissipation gel 90) and to maintain the MOSFETs 800 at the corresponding predetermined positions. Therefore, the present configuration enables to dissipate heat of the MOSFETs 800 efficiently to the first thermal conductive portion 900 via the base 24. In addition, the present configuration enables to reduce the size of the motor device 16 in the axial direction. In particular, according to the present embodiment, a part of the MOSFETs 800 is located in the fifth recessed portion 2413 in the axial direction, thereby to enable to further downsize the motor device 16.

In addition, according to the present embodiment, the third recessed portion 2408 is formed on the one side 2400 of the base 24. The sensor magnet 36 is accommodated in the third recessed portion 2408. Therefore, the present configuration enables to reduce the size of the motor device 16 in the axial direction.

In addition, according to the present embodiment, the first recessed portion 2402 is formed on the one side 2400 of the base 24. The one end of the motor axis 30 and the bearing 28 are accommodated in the first recessed portion 2402. The printed circuit board 78 is substantially in the crank form to circumvent the bearing 28 and the motor axis 30. In addition, the printed circuit board 78 is located on the side of the rear side 2405 such that the printed circuit board 78 does not overlap with the first recessed portion 2402 in the projection view along the axial direction. According to the present configuration, the printed circuit board 78 does not overlap with the bearing 28 and the motor axis 30 in the projection view along the axial direction. Therefore, the motor device 16 can be downsized.

In addition, according to the present embodiment, the multiple second recessed portions 2403 and the multiple reinforcement portions 2404 are formed in the one side 2400 of the base 24. The second recessed portions 2403 accommodate the winding 48, respectively. The present configuration enables to downsize the motor device 16 in the axial direction. In addition, the second recessed portions 2403 and the reinforcement portions 2404 are arranged alternately in the circumferential direction. Therefore, the present configuration enables to enhance the rigidity of the base 24 while enabling to downsize the motor device 16, compared with a configuration where an annular second recessed portion 2403 is formed.

In addition, according to the present embodiment, the MOSFETs 800 and the driver IC 801 are equipped to circumvent the sensor magnet 36 in the projection view along the axial direction. In addition, the fifth recessed portions 2413 are formed correspondingly to the MOSFETs 800 and the driver IC 801, respectively. Specifically, the third recessed portion 2408, which accommodates the sensor magnet 36, and the fifth recessed portions 2413, which correspond to the MOSFETs 800 and the driver IC 801 respectively, are formed in the base 24. In the present configuration, the third recessed portion 2408 and the fifth recessed portions 2413 are formed not to overlap with each other in the projection view from the axial direction. Therefore, the present configuration enables to further downsize the motor device 16 in the axial direction.

According to the present embodiment, the first protrusion 845 of the external connector 84 is inserted into in the hole portion 2421 of the base 24. It is noted that, a configuration may be employable where the length of the second protrusion 846 is elongated to be longer than the first protrusion 845, and where the second protrusion 846 is inserted in the hole portion 2421 of the base 24.

Second Embodiment

The present embodiment may refer to the precedence embodiment(s). Accordingly, a description, which is common to that of the motor device 16 in the precedence embodiment(s), will be omitted.

Figure 13:
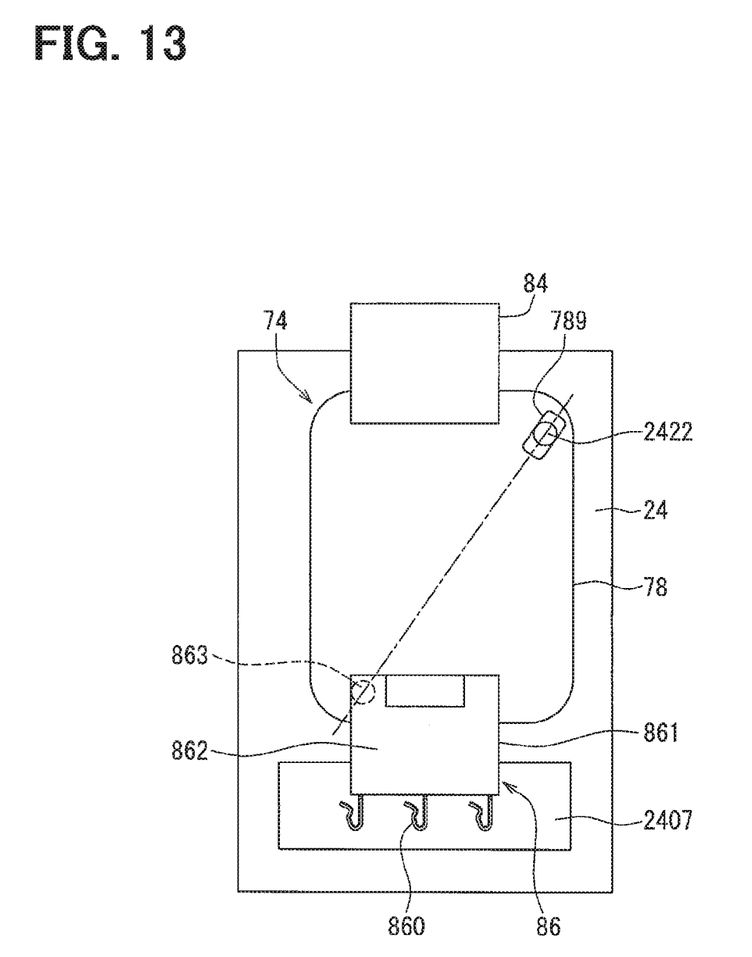
FIG. 13 is a view showing a positioning configuration of a motor device according to a second embodiment.

In the first embodiment, the external connector 84 is positioned relative to the base 24 (case 76) with accuracy. To the contrary, the present embodiment shows an example, which enables to position the internal connector 86 relative to the base 24 (case 76) with sufficient accuracy. FIG. 13 shows the physical relationship among the base 24, the circuit board 74, the external connector 84, and the internal connector 86. FIG. 13 is a simplified illustration corresponding to FIG. 5.

The example shown in FIG. 13 employs the positioning configuration of the first protrusion 845, the through hole 784, and the hole portion 2421 relative to the protrusion 863 of the internal connector 86 shown in FIG. 11. In addition, the printed circuit board 78 has the through hole 789 in its end on the opposite side of a portion to which the internal connector 86 is equipped. The through hole 789 is in an elongated hole shape in which its length (height) in the radial direction centered on a through hole (not shown), which corresponds to the protrusion 863, is longer than its length (width) in the circumferential direction centered on the through hole (not shown), which corresponds to the protrusion 863. In other words, the protrusion 863 is located on an extension of the through hole 789 in the longitudinal direction. The extension may be shown by the chain line in FIG. 13. Features other than the configuration of the above-described configuration of the present embodiment are equivalent to those of the first embodiment.

The present configuration enables to position the internal connector 86 relative to the base 24 (case 76) sufficient accuracy. In addition, the present configuration enables to detect the rotation angle of the motor 20 with sufficient accuracy. As described above, the present configuration enables to position the internal connector 86 relative to the base 24 with sufficient accuracy. More specifically, the present configuration enables to position the terminals 860 relative to the joint portions 480 of the windings 48 with sufficient accuracy. Therefore, the present configuration facilitates a welding process. Accordingly, the present configuration enables to restrict the windings 48 and the terminals 860 from causing defective connection therebetween.

It is noted that, the above description has been made about application of the positioning configuration to the protrusion 863. It is further noted that, the positioning configuration may be applicable to the protrusion 864 of the protrusions 863 and 864.

The disclosure of the specification is not limited to the above-described embodiments. The disclosure includes the embodiments and modifications made by a person skilled in the art based on the embodiments. For example, the disclosure is not limited to combinations of the elements shown in the embodiments. The disclosure can be reduced in practice with various combinations. The technical scope of the present disclosure is not limited to the description of the embodiments. The technical scope of the disclosure should be construed to encompass various modifications.

In the above embodiments, the valve timing control apparatus 10 controls the valve timing of the intake valve. It is noted that, the valve timing control apparatus 10 may be applicable to a device, which controls a valve timing of an exhaust valve, as a movable valve, and to a device, which controls valve timings of both the intake valve and the exhaust valve, as movable valves.

In the embodiments, the hail elements 805 are shown as an example of a magnetoelectric conversion element, which detects the rotation angle of the motor 20. It is noted that, the magnetoelectric conversion element may employ, for example, a magneto-resistive effect element.

The connection structure between the three-phase output lines of the inverter and the windings 48 in the circuit board 74 is not limited to the internal connector 86. The connection structure may employ another electric connection structure than an internal connector 106.

In the above embodiments, the motor device 16 is used for the valve timing control apparatus 10. The motor device 16 may be applied to another motor device.

The above-described motor device includes the case 76, the motor 20, the circuit board 74, and the connectors 84 and 86. The case 76 includes the base 24 and the cover 72. The base 24 has the first through hole 2414. The cover 72 forms the accommodation space with the base. The motor 20 includes the stator 32, the rotor 34 rotational inside the stator, and the sensor magnet 36. The sensor magnet is mounted on the surface of the rotor on the side of the base to detect the rotary position of the rotor. The motor is located on the side of the one side 2400, which is on the opposite of the cover mounting surface 2405 of the base to which the cover is mounted. The circuit board 74 has the one side 780 and the rear side 781. The one side 780 is opposed to the base. The rear side 781 is the opposite surface of the one side in the thickness direction. The circuit board 74 includes the printed circuit board 78, the magnetoelectric conversion element 805, and the multiple electronic components 80. The printed circuit board is located in the accommodation space and may be affixed to the cover mounting surface. The magnetoelectric conversion element is mounted on the one side and are opposed to the sensor magnet through the first through hole. The multiple electronic components are mounted on both the one side and the rear side of the printed circuit board. The circuit board 74 forms the circuit with the printed circuit board and the electronic components to drive the motor. The connector 84 and/or 86 includes the terminal 840 or 860 and the housing 841 or 861. The terminal is mounted on the printed circuit board. The housing includes the body portion 842 or 862, which is mainly located on the side of the rear side of the printed circuit board and supports the terminal. The housing includes the first protrusion 845 projected from the body toward the base for positioning. The printed circuit board has the second through hole 784 and the third through hole 789. The first protrusion is inserted in the second through hole 784. The base has the hole portion 2421 and includes the second protrusion 2422. The tip end of the protrusion is inserted in the hole portion through the second through hole. The second protrusion is projected toward the printed circuit board for positioning. The second protrusion is inserted in the third through hole.

In the present configuration, the first protrusion of the connector is inserted in the hole portion of the base. Therefore, the present configuration enables to position the connector relative to the base and/or the case with sufficient accuracy.

The first protrusion of the connector is inserted through the second through hole of the printed circuit board and is further inserted into the hole portion of the base. At this positioning location, the circuit board is positioned relative to the base via the first protrusion. It is noted that, the second protrusion, which is equipped to the base, is inserted in the third through hole of the printed circuit board. At this positioning location, the circuit board is positioned relative to the base without via the connector. In the present configuration, the positioning is made at the two locations thereby to enable to restrict the positional deviation of the circuit board in the rotational direction. Therefore, the present configuration enables to oppose the magnetoelectric conversion element, which is mounted on the printed circuit board, to the sensor magnet through the through hole, which is formed in the base, with sufficient accuracy. That is, the present configuration enables to detect the rotation angle of the motor with sufficient accuracy.

It should be appreciated that while the processes of the embodiments of the present disclosure have been described herein as including a specific sequence of steps, further alternative embodiments including various other sequences of these steps and/or additional steps not disclosed herein are intended to be within the steps of the present disclosure.

While the present disclosure has been described with reference to preferred embodiments thereof, it is to be understood that the disclosure is not limited to the preferred embodiments and constructions. The present disclosure is intended to cover various modification and equivalent arrangements. In addition, while the various combinations and configurations, which are preferred, other combinations and configurations, including more, less or only a single element, are also within the spirit and scope of the present disclosure.

What is claimed is:

1. A motor device comprising:
a case including a metallic housing, a base and a cover, the base having a first through hole, a surface, and a cover mounting surface, which is on an opposite side of the surface, the cover mounted to the cover mounting surface and defining an accommodation space with the base;
a motor including a stator, a rotor, and a sensor magnet, the rotor rotational inside the stator, the sensor magnet mounted on a face of the rotor on a side of the base for detection of a rotary position of the rotor, the motor located on a side of the surface of the base;
a circuit board located in the accommodation space and including a printed circuit board and a plurality of electronic components forming a circuit to drive the motor, the printed circuit board having a one side, which is opposed to the base, and a rear side, which is an opposite surface of the one side in a thickness direction, the electronic components mounted on both the one side and the rear side of the printed circuit board, the electronic components including a magnetoelectric conversion element mounted on the one side of the printed circuit board and opposed to the sensor magnet through the first through hole of the base; and
a connector including a terminal and a housing, the terminal mounted on the printed circuit board, the housing including a body located mainly on a side of the rear side of the printed circuit board and supporting the terminal, wherein
the housing of the connector has a first protrusion projected from the body toward the base for positioning,
the printed circuit board has a second through hole and a third through hole, the first protrusion of the connector inserted in the second through hole,
the base has a hole portion and a second protrusion,
the first protrusion of the connector has a tip end inserted through the second through hole of the printed circuit board and further inserted in the hole portion of the base, and
the second protrusion of the base is projected toward the printed circuit board and is inserted in the third through hole for positioning;
wherein the second through hole is formed on a one-end side of the printed circuit board, and the third through hole is formed on an other-end side of the printed circuit board in a longitudinal direction of the printed circuit board, which is perpendicular to the thickness direction.

2. The motor device according to claim 1, wherein
the third through hole of the printed circuit board is in an elongated hole shape,
the third through hole has a first length in a circumferential direction centered on the second through hole of the printed circuit board,
the third through hole has a second length in a radial direction centered on the second through hole, and
the second length is larger than the first length.

3. The motor device according to claim 1, wherein the case has an opening defined by the metallic housing, the base and the cover, the connector is configured to electrically relay the printed circuit board with an external device, the connector is partially projected through the opening to an outside of the case, the motor device further comprising: a sealing member interposed between a periphery the opening, which is defined by an inner surface of the case, and a portion of the body of the connector, which is opposed to the periphery of the opening, and the sealing member is configured to air tightly seal the accommodation space.

4. The motor device according to claim 3, wherein
the base includes a groove portion in the periphery of the opening,
the sealing member is equipped to the groove portion,
the groove portion has a bottom surface, a first inclined surface, and a second inclined surface,
the first inclined surface is connected to one end of the bottom surface, and
the second inclined surface is connected to an other end of the bottom surface on an opposite side of the one end.

5. The motor device according to claim 1, wherein
the stator includes a stator core and a winding, which is wound around the stator core,
the connector is entirely located in the accommodation space, and
the terminal is electrically connected with the winding.

6. The motor device according to claim 1, wherein
the motor device is equipped to a valve timing control apparatus configured to control a valve timing of an internal combustion engine by using rotation of the motor.

* * * * *